(12) United States Patent
Li et al.

(10) Patent No.: US 11,322,561 B2
(45) Date of Patent: May 3, 2022

(54) PHOTORESIST COMPOSITION, PIXEL DEFINITION LAYER, DISPLAY SUBSTRATE AND METHOD FOR PREPARING THE SAME, AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Wei Li, Beijing (CN); Jingjing Xia, Beijing (CN); Bin Zhou, Beijing (CN); Jun Cheng, Beijing (CN); Yingbin Hu, Beijing (CN); Wei Song, Beijing (CN); Guangyao Li, Beijing (CN); Biao Luo, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/394,401

(22) Filed: Apr. 25, 2019

(65) Prior Publication Data
US 2020/0035765 A1  Jan. 30, 2020

(30) Foreign Application Priority Data
Jul. 27, 2018 (CN) .......................... 201810844368.4

(51) Int. Cl.
*H01L 27/32* (2006.01)
*H01L 51/00* (2006.01)
(Continued)

(52) U.S. Cl.
CPC .......... *H01L 27/3246* (2013.01); *G03F 7/031* (2013.01); *G03F 7/033* (2013.01);
(Continued)

(58) Field of Classification Search
CPC ............. H01L 27/3246; H01L 27/3283; H01L 51/0005; H01L 51/0018; H01L 51/0021;
(Continued)

(56) References Cited

U.S. PATENT DOCUMENTS 6,060,728 A * 5/2000 Ghosh ................. H01L 27/3283
257/88
6,548,149 B1 * 4/2003 Liu ......................... B32B 27/20
156/235
(Continued)

FOREIGN PATENT DOCUMENTS

CN     102616044 A    8/2012
CN     102969333 A    3/2013
(Continued)

OTHER PUBLICATIONS

First Office Action for Chinese Application No. 201810844368.4, dated Jan. 4, 2021, 9 Pages.

*Primary Examiner* — Sheikh Maruf
(74) *Attorney, Agent, or Firm* — Brooks Kushman P.C.

(57) ABSTRACT

The present disclosure provides a photoresist composition, a pixel definition layer, a display substrate and a method for preparing the same, and a display device. The photoresist composition includes: 5 to 25 wt % of polymethacrylate; 1 to 15 wt % of a lyophobic compound; 1 to 5 wt % of a temperature sensitive polymer; 0.5 to 2 wt % of a photoinitiator; and 0.1 to 1 wt % of a monomer.

14 Claims, 2 Drawing Sheets

(51) Int. Cl.
  *G03F 7/031* (2006.01)
  *G03F 7/033* (2006.01)
  *G03F 7/16* (2006.01)
  *H01L 51/56* (2006.01)
  *H01L 51/52* (2006.01)

(52) U.S. Cl.
  CPC ............... G03F 7/16 (2013.01); G03F 7/168 (2013.01); H01L 27/3283 (2013.01); H01L 51/004 (2013.01); H01L 51/0005 (2013.01); H01L 51/0018 (2013.01); H01L 51/0021 (2013.01); H01L 51/0026 (2013.01); H01L 51/56 (2013.01); H01L 51/5221 (2013.01); H01L 2251/556 (2013.01)

(58) Field of Classification Search
  CPC ... H01L 51/0026; H01L 51/004; H01L 51/56; H01L 51/5221; H01L 2251/556; G03F 7/031; G03F 7/033; G03F 7/16; G03F 7/168; G03F 7/0046; G03F 7/004; G03F 7/027
  USPC ............... 257/89, 72, 40, 88; 438/34, 45, 23
  See application file for complete search history.

(56) References Cited

U.S. PATENT DOCUMENTS

| | | | | |
|---|---|---|---|---|
| 2004/0115370 A1* | 6/2004 | Funakoshi | ............... | B41M 5/52 428/32.1 |
| 2004/0191433 A1* | 9/2004 | Sakaguchi | ............ | B41M 5/52 428/32.34 |
| 2009/0195152 A1* | 8/2009 | Sawano | ................ | H01L 27/322 313/504 |
| 2011/0187267 A1* | 8/2011 | Yamamoto | .......... | H01L 51/0005 313/504 |
| 2011/0198990 A1* | 8/2011 | Yoshida | ................. | H05B 33/10 313/504 |
| 2012/0193658 A1* | 8/2012 | Matsushima | ....... | H01L 27/3223 257/89 |
| 2012/0267619 A1* | 10/2012 | Yamada | ................ | H01L 51/506 257/40 |
| 2012/0313509 A1* | 12/2012 | Takagi | ................... | H05B 33/10 313/504 |
| 2014/0131310 A1* | 5/2014 | Jiang | ................. | G02F 1/133516 216/24 |
| 2014/0202531 A1* | 7/2014 | Oya | ........................ | C09D 5/24 136/256 |
| 2014/0203303 A1* | 7/2014 | Jiang | ....................... | H01L 51/56 257/88 |
| 2014/0225499 A1* | 8/2014 | Ren | ..................... | G02B 5/3083 313/504 |
| 2015/0028310 A1* | 1/2015 | Dai | ..................... | H01L 27/3246 257/40 |
| 2016/0153968 A1* | 6/2016 | Wadhwa | .......... | G01N 33/57484 424/62 |
| 2016/0326372 A1* | 11/2016 | Mizuno | ................ | C07D 277/64 |
| 2016/0343940 A1* | 11/2016 | Kong | ..................... | H01L 51/56 |
| 2016/0372527 A1* | 12/2016 | Takashige | ........ | H01L 51/5012 |
| 2017/0047556 A1* | 2/2017 | Lee | ......................... | H01L 51/56 |
| 2017/0125719 A1* | 5/2017 | Noh | ......................... | H01L 51/56 |
| 2017/0223442 A1* | 8/2017 | Kuwabara | ............ | F21V 33/0056 |
| 2018/0138411 A1* | 5/2018 | Hung | ................ | H01L 27/3246 |
| 2018/0224783 A1* | 8/2018 | Matsumura | ........ | G03G 9/08755 |
| 2019/0013371 A1* | 1/2019 | Kim | ........................ | H01L 51/56 |
| 2019/0067395 A1* | 2/2019 | Kondo | ................ | H01L 51/5234 |
| 2019/0148468 A1* | 5/2019 | Jia | ....................... | H01L 27/3246 257/40 |
| 2019/0181376 A1* | 6/2019 | Kim | ..................... | H01L 27/3223 |
| 2019/0196633 A1* | 6/2019 | Lin | ........................ | G06F 3/041 |
| 2019/0217651 A1* | 7/2019 | Ikeyama | ............. | B41C 1/1041 |
| 2019/0371873 A1* | 12/2019 | Cui | ..................... | H01L 51/0005 |
| 2020/0091249 A1* | 3/2020 | Liu | ..................... | H01L 51/5206 |
| 2020/0232889 A1* | 7/2020 | Vossgrone | ........ | G01N 1/2813 |

FOREIGN PATENT DOCUMENTS

| | | |
|---|---|---|
| CN | 103189797 A | 7/2013 |
| CN | 106783918 A | 5/2017 |
| CN | 107759726 A | 3/2018 |
| JP | H04298559 A | 10/1992 |
| JP | 2007190879 A | 8/2007 |
| JP | 2008287251 A | 11/2008 |

* cited by examiner

PHOTORESIST COMPOSITION, PIXEL DEFINITION LAYER, DISPLAY SUBSTRATE AND METHOD FOR PREPARING THE SAME, AND DISPLAY DEVICE

CROSS-REFERENCE TO RELATED APPLICATION

This application claims priority to Chinese Patent Application No. 201810844368.4 filed on Jul. 27, 2018, which is incorporated herein by reference in its entirety.

TECHNICAL FIELD

The present disclosure relates to the field of display, in particular to a photoresist composition, a pixel definition layer, a display substrate and a method for preparing the same, and a display device.

BACKGROUND

Methods for preparing organic electroluminescent layers of organic light-emitting diodes (OLEDs) are mainly an evaporation process and a solution process.

The inkjet printing technology of the solution process is used to accurately drop a solution of luminescent materials into a sub-pixel region, and the solvent is volatilized to form a film. As compared with vacuum evaporation technology, inkjet printing is suitable for macromolecular luminescent materials and small molecule luminescent materials, has a high material utilization rate, a low equipment cost, a high productivity, and is easy to produce large-scale and large-sized products.

Inkjet printing technology requires to prepare a pixel definition layer on the electrodes of the substrate in advance to define an accurate flowing of ink into a designated pixel region. The top region of the pixel definition layer needs to have lyophobic property to prevent the ink from spreading in the top region, thereby contaminating adjacent pixel regions. At the same time, the bottom region of the pixel definition layer needs to exhibit lyophilic property to the ink, to ensure that the ink spreads evenly inside the pixel opening region to form a film layer having a uniform thickness. Therefore, the desired pixel definition layer should have a gradient change from lyophobic property to lyophilic property from top to bottom.

In the related art, in order to distinguish the pixel definition layer at the top from the lyophilic and lyophobic regions at the bottom, a pixel definition layer is often formed by using two or more layers of materials having different lyophilic and lyophobic properties. This method is complicated, and thus limits the application of inkjet printing technology.

SUMMARY

The present disclosure provides a photoresist composition, including: 5 to 25 wt % of polymethacrylate; 1 to 15 wt % of a lyophobic compound; 1 to 5 wt % of a temperature sensitive polymer; 0.5 to 2 wt % of a photoinitiator; and 0.1 to 1 wt % of a monomer.

In an exemplary embodiment, the photoresist composition includes: 5 to 25 wt % of polymethacrylate; 3 to 10 wt % of the lyophobic compound; 3 to 5 wt % of the temperature sensitive polymer; 0.5 to 2 wt % of the photoinitiator; and 0.1 to 1 wt % of the monomer.

Optionally, a mass ratio of the lyophobic compound to the temperature sensitive polymer is 1:1 to 3:1.

Further optionally, a mass ratio of the lyophobic compound to the temperature sensitive polymer is 1:1 to 2:1.

Further, the composition further includes 0.1 to 1 wt % of an additive and a balance of a solvent.

Optionally, the temperature sensitive polymer is poly(N-isopropylacrylamide) or oligomeric polyethyleneglycol methyl ether methacrylate.

Optionally, the lyophobic compound is fluorine-containing polymethyl methacrylate.

Optionally, the photoinitiator is one or more of nitroaniline, anthraquinone, benzophenone, and N-acetyl-4-nitronaphthylamine.

Optionally, the monomer is one or more of dipentaerythritol pentaacrylate, dipentaerythritol hexaacrylate, polyurethane acrylate, and ethoxylated pentaerythritol tetraacrylate.

Optionally, the additive is one or more of a polymerization inhibitor, a leveling agent, an antifoaming agent, and a stabilizer. For example, the polymerization inhibitor may include one or more of hydroquinone, 2-sec-butyl-4,6-dinitrophenol, p-tert-butyl catechol, and 2,5-di-tert-butyl hydroquinone. The leveling agent may include acrylic compounds, organosilicone compounds, fluorocarbon compounds, and the like. The antifoaming agent may include emulsified silicone oil, high-carbon alcohol fatty acid ester complex, polyoxyethylene polyoxypropylene pentaerythritol ether, polyoxyethylene polyoxypropylene ether, polyoxypropylene glycerol ether, polyoxypropylene polyoxyethylene glycerol ether, polydimethylsiloxane and the like. The stabilizer may be at least one of isoamylol, n-hexanol, glycerol, or n-hexane. Optionally, the solvent is one or more of N-methylpyrrolidone, glycol ether, ethylene glycol alkyl ether acetate, diethylene glycol, propylene glycol monomethyl ether acetate, ethoxyethyl acetate, dimethoxyacetaldehyde, propylene glycol methyl ether acetate, ethyl 3-ethoxypropionate, propylene glycol methyl ether, and ethylene glycol ethyl ether acetate.

The present disclosure provides a pixel definition layer, including the photoresist composition of the above technical solution, the pixel definition layer exhibiting a lyophobic property at a first temperature and a lyophilic property at a second temperature.

Optionally, the temperature sensitive polymer is poly(N-isopropylacrylamide), and the first temperature is higher than the second temperature.

The present disclosure provides an organic electroluminescent display substrate, including the pixel definition layer of the above technical solution.

The present disclosure provides a method for preparing an organic electroluminescent display substrate, including: coating the photoresist composition of the above technical solution on a substrate, followed by removing solvents and curing, and patterning the cured photoresist composition to form a pixel definition layer, in which the pixel definition layer defines a plurality of pixel regions; placing ink into the plurality of pixel regions through an inkjet printing process at a first temperature; spreading the ink at a second temperature, removing solvents and baking to form an organic functional layer, in which pixel definition layer exhibits a lyophobic property at a first temperature and a lyophilic property at a second temperature; and evaporating a cathode layer on the pixel definition layer and the organic functional layer to form the organic electroluminescent display substrate.

Optionally, the method further includes performing a vacuum evacuation treatment at a second temperature for 30 to 60 seconds to spread the ink.

The present disclosure also provides a display device, including the organic electroluminescence display substrate of the above technical solution.

DETAILED DESCRIPTION

Figure 1:
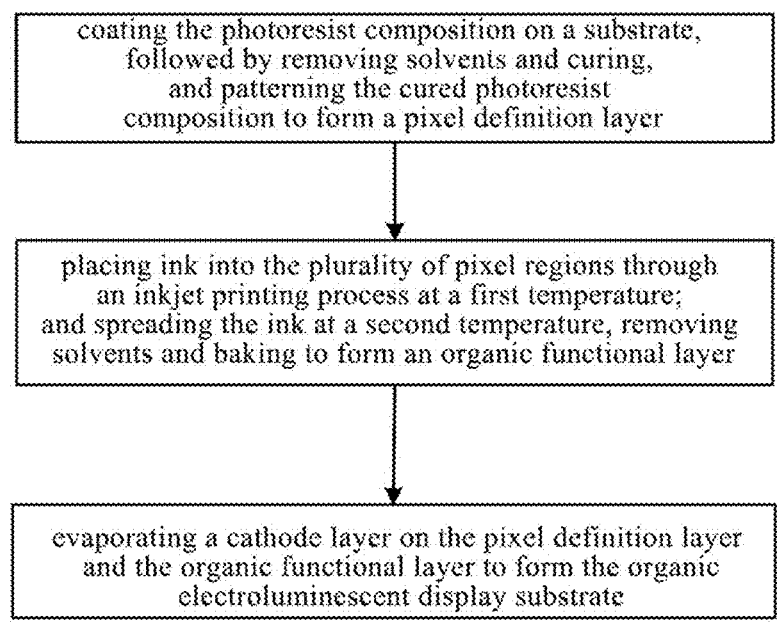
FIG. 1 is a flow chart showing the preparation of an organic electroluminescence display substrate.

In order to better understand the present disclosure, the optional embodiments of the present disclosure will be described below in combination with Examples, but it should be understood that these descriptions are merely used to further illustrate the features and advantages of the present disclosure and are not intended to limit the present disclosure.

An embodiment of the present disclosure discloses a photoresist composition, including: 5 to 25 wt % of polymethacrylate; 1 to 15 wt % of a lyophobic compound; 1 to 5 wt % of a temperature sensitive polymer; 0.5 to 2 wt % of a photoinitiator; 0.1 to 1 wt % of a monomer; 0.1 to 1 wt % of additives; and a balance of a solvent.

In the present disclosure, the lyophobic compound and the temperature sensitive polymer are used in combination, to achieve different lyophilic property and lyophobic property at different temperatures.

Optionally, the lyophobic compound is fluorine-containing polymethyl methacrylate.

Optionally, the temperature sensitive polymer is poly(N-isopropylacrylamide) or oligomeric polyethyleneglycol methyl ether methacrylate. The temperature sensitive polymer can exhibit a reversible transition between hydrophilicity and hydrophobicity at different temperatures. Under a low temperature conditions, the temperature sensitive polymer can exhibit lyophilic property by forming hydrogen bonds. Under high temperature conditions, the hydrophobic interaction gradually plays a major role due to the destruction of hydrogen bonds, and thus it exhibited a lyophobic property. Through extensive experiments, the inventor had found that the lyophobic property of the temperature sensitive polymer is not strong, in particular to after being added to the photoresist composition, and did not allow the photoresist composition to exhibit a better lyophobic property. The lyophobic property of the photoresist composition can be improved by adding a lyophobic compound to the temperature sensitive polymer.

Optionally, a mass ratio of the lyophobic compound to the temperature sensitive polymer is 1:1 to 3:1.

In the present disclosure, the polymethacrylate may generally be polymethyl methacrylate.

The photoinitiator may be one or more of nitroaniline, anthraquinone, benzophenone, and N-acetyl-4-nitronaphthylamine.

The monomer may be one or more of dipentaerythritol pentaacrylate, dipentaerythritol hexaacrylate, polyurethane acrylate, and ethoxylated pentaerythritol tetraacrylate.

The additive may be one or more of a polymerization inhibitor, a leveling agent, an antifoaming agent, and a stabilizer. For example, the polymerization inhibitor includes one or more of hydroquinone, 2-sec-butyl-4,6-dinitrophenol, p-tert-butyl catechol, and 2,5-di-tert-butyl hydroquinone. The leveling agent includes an acrylic compound, an organosilicone compound, a fluorocarbon compound, and the like. The antifoaming agent includes emulsified silicone oil, high-carbon alcohol fatty acid ester complex, polyoxyethylene polyoxypropylene pentaerythritol ether, polyoxyethylene polyoxypropylene ether, polyoxypropylene glycerol ether, polyoxypropylene polyoxyethylene glycerol ether, polydimethylsiloxane and the like. The stabilizer is at least one of isoamylol, n-hexanol, glycerol, or n-hexane.

The solvent may be one or more of N-methylpyrrolidone, glycol ether, ethylene glycol alkyl ether acetate, diethylene glycol, propylene glycol monomethyl ether acetate, ethoxyethyl acetate, dimethoxyacetaldehyde, propylene glycol methyl ether acetate, ethyl 3-ethoxypropionate, propylene glycol methyl ether, and ethylene glycol ethyl ether acetate.

Under ultraviolet light irradiation, the photoinitiator initiates a crosslinking reaction between the monomer and the polymethacrylate to form a film layer structure after curing. The lyophobic compound and the temperature sensitive polymer are distributed in the film layer structure.

The embodiment of the present disclosure discloses a pixel definition layer that is made of the photoresist composition of the above technical solution, the pixel definition layer exhibiting a lyophobic property at a first temperature and a lyophilic property at a second temperature.

In the present disclosure, the pixel definition layer defines a plurality of pixel regions, including a plurality of spacer substrates, and the pixel spacer regions are arranged between the spacer substrates. The pixel definition layer is made of the photoresist composition of the above technical solution, and exhibits a lyophobic property at a first temperature and a lyophilic property at a second temperature.

In the photoresist composition, the lyophobic compound is fluorine-containing polymethyl methacrylate. Optionally, the temperature sensitive polymer is poly(N-isopropylacrylamide) or oligomeric polyethyleneglycol methyl ether methacrylate.

When the temperature sensitive polymer is poly(N-isopropylacrylamide), the first temperature is higher than the second temperature.

Optionally, a mass ratio of the lyophobic compound to the temperature sensitive polymer is 1:1 to 3:1. The two substances in this ratio range are guaranteed to maintain the lyophobic property at the first temperature and to be converted to the lyophilic property at the second temperature.

In the present disclosure, the pixel definition layer exhibits a lyophobic property at a first temperature. When the inkjet printing process is performed at the first temperature, the ink does not spread over the top of the pixel definition layer, and the ink directly falls inside the plurality of pixel regions defined by the pixel definition layer, thereby avoiding cross coloring. At the second temperature, the pixel definition layer exhibits a lyophilic property and the ink can spread evenly throughout the plurality of pixel regions.

The present disclosure provides an organic electroluminescent display substrate, including the pixel definition layer of the above technical solution.

The present disclosure provides a method for preparing an organic electroluminescent display substrate (see FIG. 1 for the detailed procedures), including the following steps.

Figure 2:
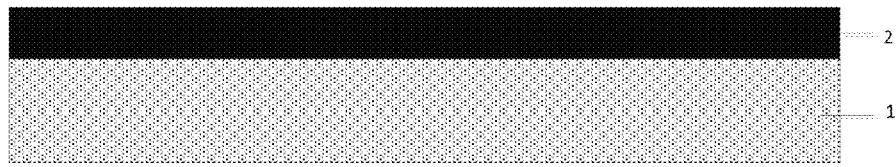
FIGS. 2 to 6 are schematic views showing the preparation of an organic functional layer through an inkjet printing process.
Figure 3:
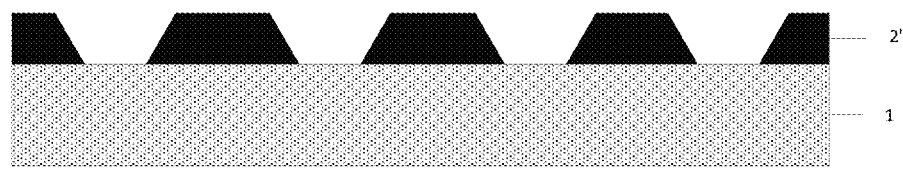

Step S1: coating the photoresist composition on a substrate, as shown in FIG. 2; followed by removing solvents and curing, and patterning the cured photoresist composition to form a pixel definition layer, in which the pixel definition layer defines a plurality of pixel regions, as shown in FIG. 3.

The photoresist composition includes: 5 to 25 wt % of polymethacrylate; 1 to 15 wt % of a lyophobic compound; 1 to 5 wt % of a temperature sensitive polymer; and 0.5 to 2 wt % of a photoinitiator; 0.1 to 1 wt % of a monomer; and 0.1 to 1 wt % of an additive and a balance of a solvent.

Figure 4:
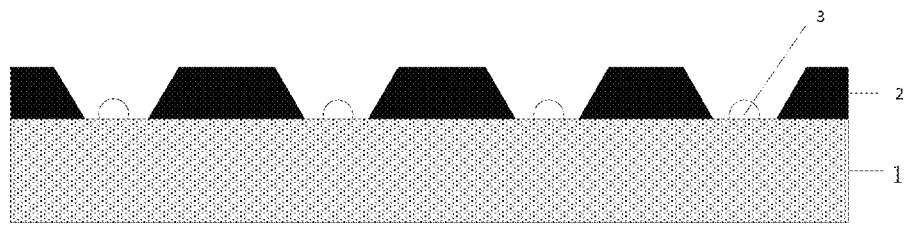
Figure 5:
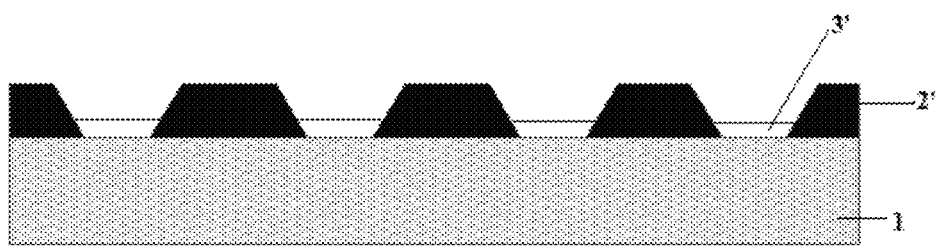
Figure 6:
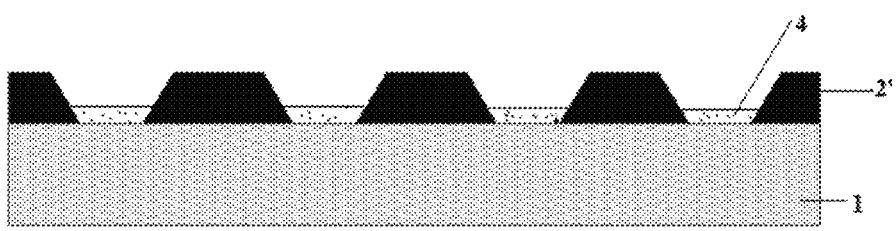

Step S2: placing ink into the plurality of pixel regions through an inkjet printing process at a first temperature, as shown in FIG. 4; spreading the ink at a second temperature, as shown in FIG. 5; and removing the solvents and baking to form an organic functional layer, as shown in FIG. 6.

Optionally, the lyophobic compound is fluorine-containing polymethyl methacrylate. When the temperature sensitive polymer is poly(N-isopropylacrylamide), the first temperature may optionally be 35 to 60° C., and further optionally be 40° C. At the first temperature, the pixel definition layer exhibits a strong lyophobic property.

The second temperature may optionally be 20 to 30° C., and further optionally be 23° C. When the temperature is adjusted to the second temperature, due to the poly(N-isopropylacrylamide) is more lyophilic, the pixel definition layer exhibits lyophilic property.

Optionally, performing a vacuum evacuation treatment at a second temperature for 30 to 60 seconds to spread the ink.

Step S3: evaporating a cathode layer on the pixel definition layer and the organic functional layer to form the organic electroluminescent display substrate.

The present disclosure also provides a display device, including the organic electroluminescence display substrate of the above technical solution.

In order to further understand the present disclosure, the photoresist composition, the pixel definition layer, the method for preparing the same and the application provided by the present disclosure will be described in detail in the following Examples, but the protection scope of the present disclosure is not limited by the following Examples.

Unless otherwise indicated, the experimental methods used in the following examples are conventional methods.

Unless otherwise indicated, the materials, the reagents and the like used in the following examples are commercially available.

Examples 1 to 10: Preparation of Photoresist Compositions

The components were mixed according to the components and their ratios shown in Table 1 to achieve a photoresist composition.

Example 11: Preparation of Organic Electroluminescent Display Substrate

The photoresist composition prepared in Example 1 was coated on a substrate, followed by removing solvents and curing, and the cured photoresist composition was patterned to form a pixel definition layer, the pixel definition layer defining a plurality of pixel regions.

Ink was placed into the plurality of pixel regions through an inkjet printing process at a temperature of 35 to 40° C. At this time, the pixel definition layer exhibited a lyophobic property, which avoided contamination of the ink in adjacent pixel regions.

The temperature was reduced to 20 to 30° C., and the ink was spread under vacuum evacuation conditions, in which the time for vacuum evacuation was 30 to 60 seconds. At this temperature, the pixel definition layer exhibited a lyophilic property, and the ink was easily spread evenly, and the film formation was very uniform. Then the solvent was further removed by pumping, and still maintained at 20 to 30° C. The residual solvent was removed by baking at a high temperature to form an organic functional layer.

A cathode layer was evaporated on the pixel definition layer and the organic functional layer to form the organic electroluminescent display substrate.

The change in the contact angle of the formed pixel definition layer was tested. The contact angle of the water droplet was 127° at 40° C., and the contact angle of the water drop was 77° at 23° C. The experimental results show that the pixel definition layer formed by the photoresist composition exhibited a lyophobic property at 40° C. and exhibited a lyophilic property at 23° C.

Examples 12 to 20: Preparation of Organic Electroluminescent Display Substrate The photoresist composition prepared in Examples 2 to 10 were coated on a substrate, followed by removing solvents and curing, and the cured photoresist composition was patterned to form a pixel definition layer, the pixel definition layer defining a plurality of pixel regions.

Ink was placed into the plurality of pixel regions through an inkjet printing process at a temperature of 35 to 40° C. At this time, the pixel definition layer exhibited a lyophobic property, which avoided contamination of the ink in adjacent pixel regions.

The temperature was reduced to 20 to 30° C., and the ink was spread the under vacuum evacuation conditions, in which the time for vacuum evacuation was 30 to 60 seconds. At this temperature, the pixel definition layer exhibited a

TABLE 1

| | polymethyl methacrylate (wt %) | fluorine-containing polymethyl methacrylate (wt %) | poly(N-isopropyl-acrylamide) (wt %) | nitro-aniline (wt %) | dipenta-erythritol penta-acrylate (wt %) | hydro-quinone (wt %) | organo-silicone compound (wt %) | emulsified silicone oil (wt %) | isoamylol (wt %) | N-methyl-pyrrolidone (wt %) |
|---|---|---|---|---|---|---|---|---|---|---|
| Example 1 | 5% | 15% | 5% | 1% | 0.1% | 0.1% | 0.1% | — | — | balance |
| Example 2 | 5% | 10% | 5% | 1% | 0.1% | 0.1% | 0.1% | — | — | balance |
| Example 3 | 5% | 5% | 5% | 1% | 0.1% | 0.1% | 0.1% | — | — | balance |
| Example 4 | 5% | 5% | 3% | 1% | 0.1% | 0.1% | 0.1% | — | — | balance |
| Example 5 | 5% | 3% | 1% | 1% | 0.1% | 0.1% | 0.1% | — | — | balance |
| Example 6 | 5% | 3% | 3% | 1% | 0.1% | 0.1% | 0.1% | — | — | balance |
| Example 7 | 5% | 1% | 1% | 1% | 0.1% | 0.1% | 0.1% | — | — | balance |
| Example 8 | 10% | 10% | 5% | 0.5% | 0.1% | 0.5% | — | 0.1% | — | balance |
| Example 9 | 20% | 3% | 3% | 1.5% | 1% | 0.1% | 0.1% | 0.1% | 0.1% | balance |
| Example 10 | 25% | 1% | 1% | 0.5% | 0.1% | — | — | 0.1% | 0.1% | balance | lyophilic property, and the ink was easily spread evenly, and the film formation was very uniform. Then the solvent was further removed by pumping, and still maintained at 20 to 30° C. The residual solvent was removed by baking at a high temperature to form an organic functional layer.

A cathode layer was evaporated on the pixel definition layer and the organic functional layer to form the organic electroluminescent display substrate.

The contact angle changes of the formed pixel definition layers were tested separately, and the contact angles of the water droplets at 40° C. and 23° C. were as shown in Table 2 below.

TABLE 2

| | water droplet contact angle in degree (at 40° C.) | water droplet contact angle in degree (at 23° C.) |
|---|---|---|
| Example 2 | 120 | 75 |
| Example 3 | 113 | 73 |
| Example 4 | 115 | 73 |
| Example 5 | 112 | 74 |
| Example 6 | 112 | 71 |
| Example 7 | 110 | 71 |
| Example 8 | 118 | 72 |
| Example 9 | 112 | 72 |
| Example 10 | 110 | 71 |

The experimental results show that the pixel definition layer formed by the photoresist composition exhibited a lyophobic property at 40° C. and exhibited a lyophilic property at 23° C.

Example 21: Display Device

This Example provides an inkjet printing OLED display device, in which the pixel definition layer structure was prepared by using any of the photoresist compositions of Examples 1 to 10, and the inkjet printing process was performed by using the print OLED production method.

Comparative Examples 1 to 3

The components were mixed according to the components and their ratios shown in Table 3 to achieve a photoresist composition.

TABLE 3

| | polymethyl methacrylate (wt %) | fluorine-containing polymethyl methacrylate (wt %) | poly(N-isopropyl-acrylamide) (wt %) | nitro-aniline (wt %) | dipenta-erythritol penta-acrylate (wt %) | hydro-quinone (wt %) | organo-silicone compound (wt %) | emulsified silicone oil (wt %) | isoamylol (wt %) | N-methyl-pyrrolidone (wt %) |
|---|---|---|---|---|---|---|---|---|---|---|
| Comparative Example 1 | 5% | 10% | — | 1% | 0.1% | 0.1% | 0.1% | — | — | balance |
| Comparative Example 2 | 5% | — | 5% | 1% | 0.1% | 0.1% | 0.1% | — | — | balance |
| Comparative Example 3 | 5% | 25% | 5% | 1% | 0.1% | 0.1% | 0.1% | — | — | balance |

The photoresist compositions prepared in Comparative Examples 1 to 3 were separately coated on a substrate, followed by removing solvents and curing, and the cured photoresist composition was patterned to form a pixel definition layer, the pixel definition layer defining a plurality of pixel regions.

The contact angle of the pixel definition layer was tested, and the water droplet contact angles at 40° C. and 23° C. are shown in Table 4 below.

TABLE 4

| | water droplet contact angle (at 40° C.) | water droplet contact angle (at 23° C.) |
|---|---|---|
| Comparative Example 1 | | 154° |
| Comparative Example 2 | 85° | 69° |
| Comparative Example 3 | 158° | 126° |

As can be seen from Table 4, the pixel definition layer formed by the photoresist composition of Comparative Example 1 had a contact angle of 154°, showing a lyophobic property. An inkjet printing process was performed on the pixel definition layer, and the ink was not easily spread.

The pixel definition layer formed of the photoresist composition of Comparative Example 2 had a contact angle of 85° at a temperature of 40° C., and a contact angle of 69° at a temperature of 23° C., and the lyophobic property was not strong. The inkjet printing process was performed on the pixel definition layer, and the ink tended to contaminate adjacent pixel regions.

The pixel definition layer formed of the photoresist composition of Comparative Example 3 had a contact angle of 158° at a temperature of 40° C., and a contact angle of 126° at a temperature of 23° C., and the lyophilic property was not strong. The inkjet printing process was performed on the pixel definition layer, and the ink was not easily spread.

As compared to the related art, the pixel definition layer of the present disclosure is made of the photoresist composition, which exhibits a lyophobic property at a first temperature, and exhibits a lyophilic property at a second temperature. The photoresist composition includes: 5 to 25 wt % of polymethacrylate; 1 to 15 wt % of a lyophobic compound; 1 to 5 wt % of a temperature sensitive polymer; and 0.5 to 2 wt % of a photoinitiator; 0.1 to 1 wt % of a monomer; and 0.1 to 1 wt % of additive and a balance of a solvent. The photoresist composition includes a lyophobic compound and a temperature sensitive polymer. The pixel definition layer made of the photoresist composition exhibits lyophobicity at a first temperature. Thus, when the inkjet printing process is performed at the first temperature, it can prevent the ink from spreading and remaining on top of the pixel definition layer, thereby avoiding cross coloring. At the second temperature, the pixel definition layer exhibited a lyophilic property, ensuring uniform spreading of the ink in the plurality of pixel regions, improving film uniformity, thereby improving the display effect and product quality of the OLED substrate.

The description of the above Examples is merely used for helping to understand the method according to the present disclosure and its core idea. It should be noted that a person skilled in the art may make further improvements and modifications to the disclosure without departing from the principle of the present disclosure, and these improvements and modifications shall also fall within the scope of the present disclosure.

The above description of the disclosed Examples allows one skilled in the art to implement or use the present disclosure. Various modifications to these Examples would be apparent to one skilled in the art, and the general principles defined herein may be applied to other Examples without departing from the spirit or scope of the disclosure. Therefore, the present disclosure will not be limited to the Examples shown herein, but should conform to the widest scope consistent with the principles and novel features disclosed herein.

What is claimed is:

1. A pixel definition layer, used in inkjet printing to prepare OLED devices, comprising a photoresist composition, the pixel definition layer exhibiting a lyophobic property at a first temperature and a lyophilic property at a second temperature,
   wherein the photoresist composition comprises: 5 to 25 wt % of polymethacrylate, 1 to 15 wt % of a lyophobic compound, 1 to 5 wt % of a temperature sensitive polymer, 0.5 to 2 wt % of a photoinitiator, and 0.1 to 1 wt % of a monomer;
   wherein the temperature sensitive polymer is poly(N-isopropylacrylamide), and the first temperature is higher than the second temperature;
   wherein the lyophobic compound is fluorine-containing polymethyl methacrylate; and
   wherein a mass ratio of the lyophobic compound to the temperature sensitive polymer is 1:1 to 3:1.

2. An organic electroluminescent display substrate, comprising the pixel definition layer of claim 1.

3. A method for preparing an organic electroluminescent display substrate, comprising:
   coating a photoresist composition on a substrate, followed by removing solvents and curing, and patterning the cured photoresist composition to form a pixel definition layer, wherein the pixel definition layer defines a plurality of pixel regions, wherein the photoresist composition comprises 5 to 25 wt % of polymethacrylate, 1 to 15 wt % of a lyophobic compound, 1 to 5 wt % of a temperature sensitive polymer, 0.5 to 2 wt % of a photoinitiator, and 0.1 to 1 wt % of a monomer, wherein the temperature sensitive polymer is poly(N-isopropylacrylamide), and the first temperature is higher than the second temperature;
   placing ink into the plurality of pixel regions through an inkjet printing process at a first temperature;
   spreading the ink at a second temperature, removing solvents and baking to form an organic functional layer, wherein the pixel definition layer exhibits a lyophobic property at a first temperature and a lyophilic property at a second temperature;
   evaporating a cathode layer on the pixel definition layer and the organic functional layer to form the organic electroluminescent display substrate; and
   wherein a mass ratio of the lyophobic compound to the temperature sensitive polymer is 1:1 to 3:1.

4. The method of claim 3, further comprising performing a vacuum evacuation treatment at a second temperature for 30 to 60 seconds to spread the ink.

5. The method of claim 3, wherein the temperature sensitive polymer is poly(N-isopropylacrylamide), and the first temperature is 35 to 60 ° C.

6. The method of claim 3, wherein the second temperature is 20 to 30 ° C.

7. A display device, comprising the organic electroluminescent display substrate of claim 2.

8. The pixel definition layer of claim 1, wherein the photoresist composition comprises: 5 to 25 wt % of polymethacrylate; 3 to 10 wt % of the lyophobic compound; 3 to 5 wt % of the temperature sensitive polymer; 0.5 to 2 wt % of the photoinitiator; and 0.1 to 1 wt % of the monomer.

9. The pixel definition layer of claim 1, wherein a mass ratio of the lyophobic compound to the temperature sensitive polymer is 1:1 to 2:1.

10. The pixel definition layer of claim 1, wherein the photoresist composition further comprises 0.1 to 1 wt % of an additive and a balance of a solvent.

11. The pixel definition layer of claim 1, wherein the photoinitiator is one or more of nitroaniline, anthraquinone, benzophenone, and N-acetyl-4-nitronaphthylamine.

12. The pixel definition layer of claim 1, wherein the monomer is one or more of dipentaerythritol pentaacrylate, dipentaerythritol hexaacrylate, polyurethane acrylate, and ethoxylated pentaerythritol tetraacrylate.

13. The pixel definition layer of claim 10, wherein the additive is one or more of a polymerization inhibitor, a leveling agent, an antifoaming agent, and a stabilizer.

14. The pixel definition layer of claim 10, wherein the solvent is one or more of N-methylpyrrolidone, glycol ether, ethylene glycol alkyl ether acetate, diethylene glycol, propylene glycol monomethyl ether acetate, ethoxyethyl acetate, dimethoxyacetaldehyde, propylene glycol methyl ether acetate, ethyl 3-ethoxypropionate, propylene glycol methyl ether, and ethylene glycol ethyl ether acetate.

* * * * *